(12) United States Patent
Ono

(10) Patent No.: US 10,755,948 B2
(45) Date of Patent: Aug. 25, 2020

(54) HEAT TREATMENT METHOD BY LIGHT IRRADIATION

(71) Applicant: SCREEN HOLDINGS CO., LTD., Kyoto-shi, Kyoto (JP)

(72) Inventor: Yukio Ono, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 16/001,525

(22) Filed: Jun. 6, 2018

(65) Prior Publication Data
US 2018/0358234 A1 Dec. 13, 2018

(30) Foreign Application Priority Data
Jun. 9, 2017 (JP) .................. 2017-114254

(51) Int. Cl.
*H01L 21/324* (2006.01)
*H01L 21/67* (2006.01)
(Continued)

(52) U.S. Cl.
CPC .......... *H01L 21/324* (2013.01); *H01L 21/265* (2013.01); *H01L 21/2686* (2013.01);
(Continued)

(58) Field of Classification Search
CPC ................. H01L 21/324; H01L 21/265; H01L 21/67115; H01L 21/67248; H01L 21/6875; H01L 21/68714
See application file for complete search history.

(56) References Cited

U.S. PATENT DOCUMENTS

| | | | | |
|---|---|---|---|---|
| 2004/0043575 | A1* | 3/2004 | Jacobson | A47C 31/001 438/308 |
| 2005/0118737 | A1* | 6/2005 | Takagi | H01J 37/3244 438/14 |

(Continued)

FOREIGN PATENT DOCUMENTS

| | | |
|---|---|---|
| JP | 2001-127057 A | 5/2001 |
| JP | 2010-225645 A | 10/2010 |

(Continued)

OTHER PUBLICATIONS

Taiwanese Office Action issued in corresponding Taiwanese Patent Application No. 107116412, dated Nov. 8, 2018, with English Translation of the Japanese Translation of the Taiwanese Office Action.

(Continued)

*Primary Examiner* — Fernando L Toledo
*Assistant Examiner* — Neil R Prasad
(74) *Attorney, Agent, or Firm* — McDermott Will & Emery LLP

(57) ABSTRACT

A semiconductor wafer to be treated is placed on a susceptor made of quartz installed in a chamber, and is heated by light irradiation from halogen lamps. Before the first semiconductor wafer of a production lot is transported into the chamber, a preheating substrate is placed on the susceptor. Then, the preheating substrate is heated by light irradiation from the halogen lamps to preheat the susceptor. The susceptor is heated to a preheating temperature higher than a stable temperature when the semiconductor wafers of the production lot are continuously treated. This enables a structure in the chamber, other than the susceptor, to be preheated to a temperature during steady treatment of the semiconductor wafer in a short time, so that it is possible to eliminate dummy running for heating the structure in the chamber by applying heating treatment to a plurality of dummy wafers.

4 Claims, 9 Drawing Sheets

(51) Int. Cl.
  *H01L 21/265* (2006.01)
  *H01L 21/687* (2006.01)
  *H01L 21/268* (2006.01)
(52) U.S. Cl.
  CPC .. *H01L 21/67115* (2013.01); *H01L 21/67248* (2013.01); *H01L 21/6875* (2013.01); *H01L 21/68714* (2013.01)

(56) References Cited

U.S. PATENT DOCUMENTS

| | | | | |
|---|---|---|---|---|
| 2008/0220150 | A1* | 9/2008 | Merry | C23C 16/45591 427/8 |
| 2010/0159640 | A1* | 6/2010 | Park | C23C 16/0209 438/104 |
| 2013/0276695 | A1* | 10/2013 | Pitney | H01L 21/02104 117/86 |
| 2017/0011923 | A1 | 1/2017 | Tanimura et al. | |
| 2017/0125312 | A1 | 5/2017 | Ono | |

FOREIGN PATENT DOCUMENTS

| | | |
|---|---|---|
| JP | 2017-017275 A | 1/2017 |
| JP | 2017-092102 A | 5/2017 |
| TW | 201705296 A | 2/2017 |

OTHER PUBLICATIONS

Korean Notification of Reason for Refusal issued in corresponding Korean Patent Application No. 10-2018-0065939, dated Nov. 23, 2019, with English translation.
Taiwanese Office Action issued in corresponding Taiwanese Patent Application No. 107116412, dated Feb. 11, 2020, with English Translation of the Japanese Translation of the Taiwanese Office Action.
Korean Notice of Final Rejection issued in corresponding Korean Patent Application No. 10-2018-0065939, dated May 1, 2020, with Engish translation.
Taiwanese Office Action issued in corresponding Taiwanese Patent Application No. 107116412, dated Jul. 18, 2019, with English translation of the Japanese translation of the Taiwanese Office Action.

\* cited by examiner

F I G. 3
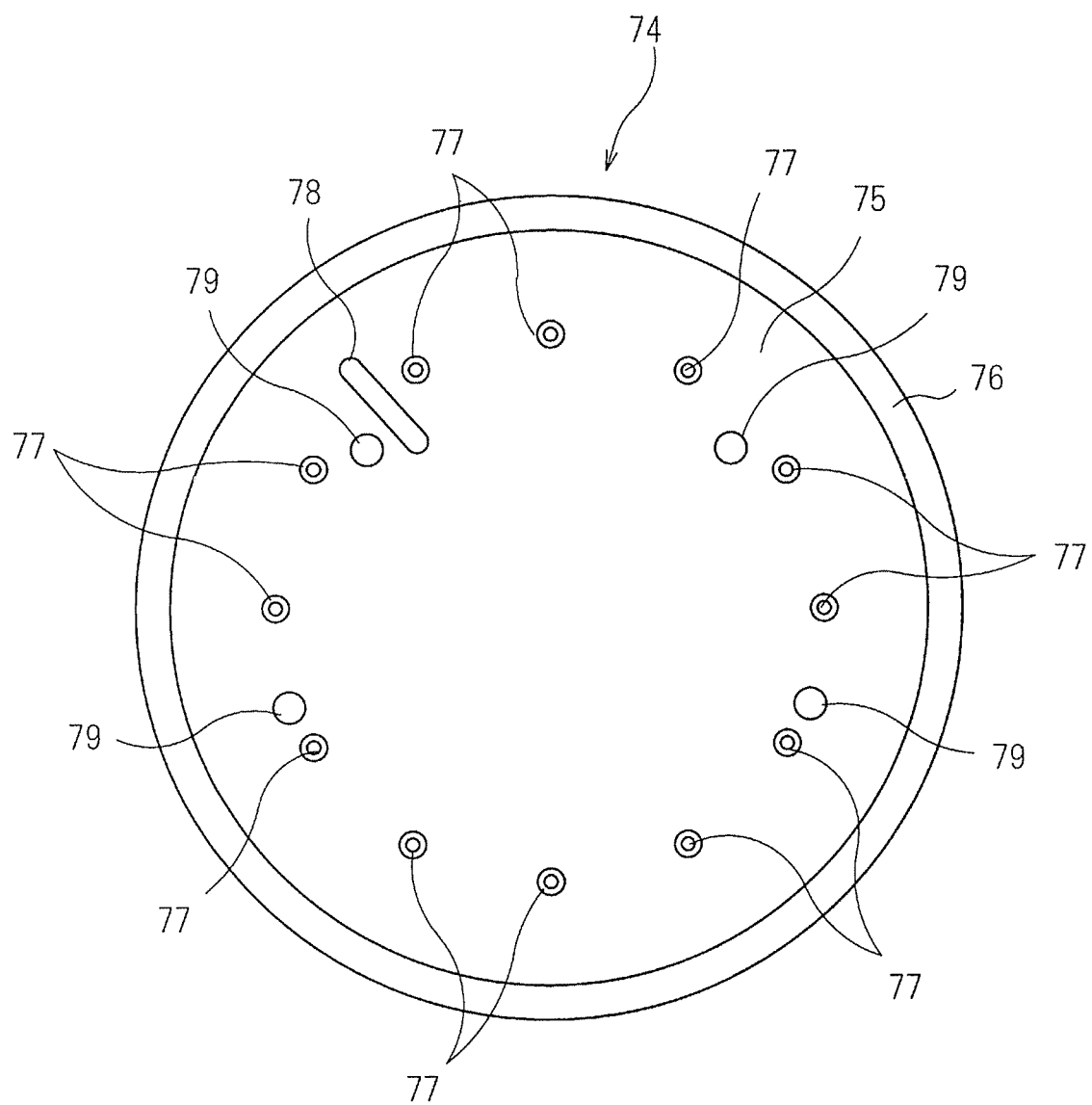

F I G . 4
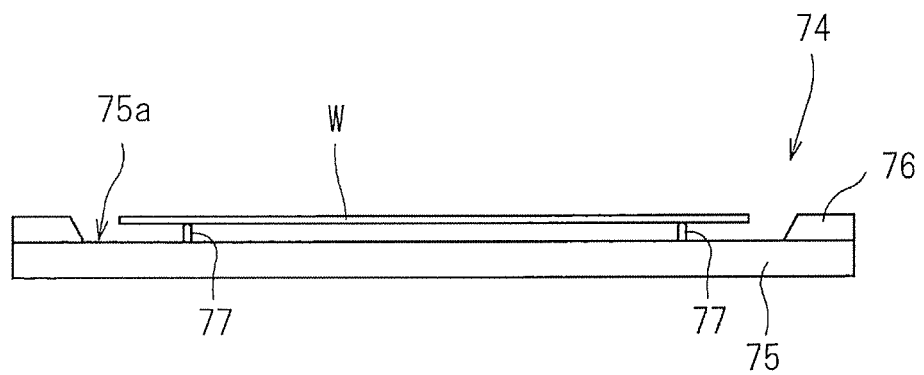

F I G . 8
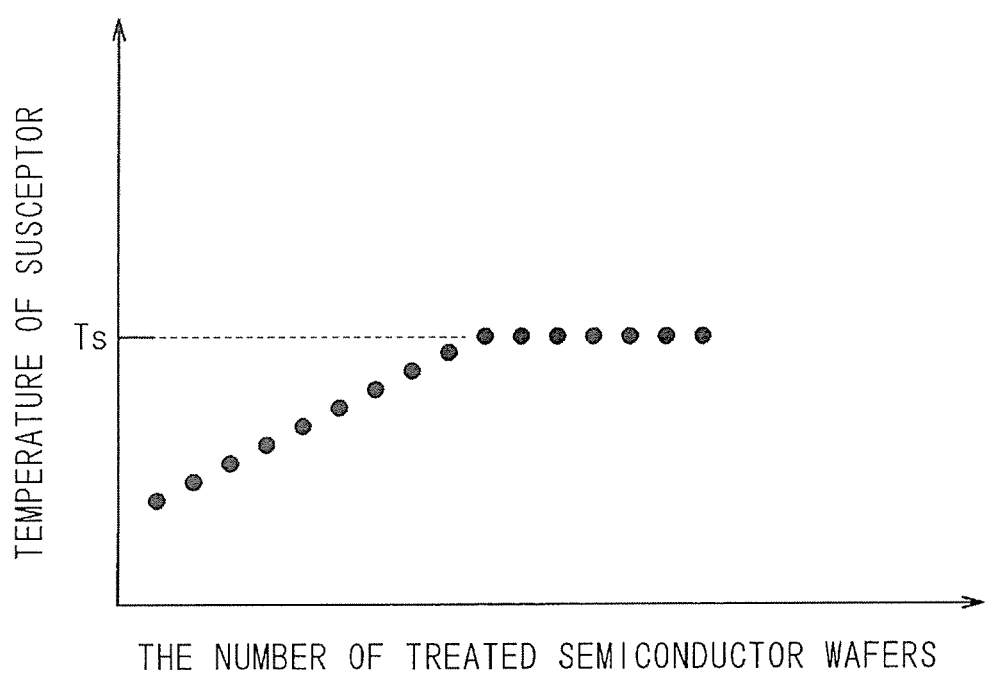

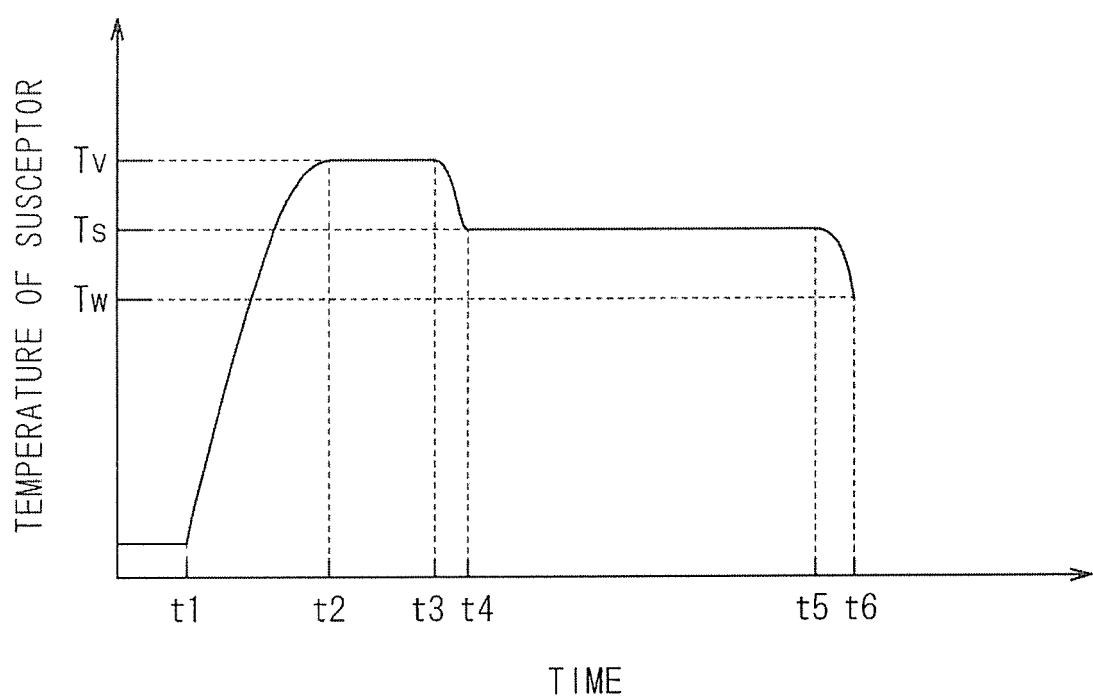
F I G . 9

HEAT TREATMENT METHOD BY LIGHT IRRADIATION

BACKGROUND OF THE INVENTION

Field of the Invention

The present invention relates to a heat treatment method for irradiating a thin-plated precision electronic substrate (hereinafter referred to as simply "substrate") such as a semiconductor wafer with light to heat the substrate.

Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

As a heat treatment apparatus using a xenon flash lamp as described above, Japanese Patent Application Laid-Open No. 2010-225645 discloses a heat treatment apparatus in which a flash lamp is disposed on a front surface side of a semiconductor wafer, and a halogen lamp is disposed on a back surface side thereof, to perform desired heat treatment by combination of the lamps, for example. In the heat treatment apparatus disclosed in Japanese Patent Application Laid-Open No. 2010-225645, the halogen lamp performs assist heating a semiconductor wafer to some extent temperature, and then a front surface of the semiconductor wafer is increased in temperature to a desired treatment temperature by irradiation of flashes of light from the flash lamp.

In general, in addition to heat treatment, treatment of a semiconductor wafer is also performed per lot (a set of semiconductor wafers subjected to the same treatment under the same condition). In a single wafer processing substrate treatment apparatus, a plurality of semiconductor wafers constituting one lot is successively and sequentially treated. Also in a flash lamp annealing apparatus, a plurality of semiconductor wafers constituting one lot is transported one by one into a chamber to be sequentially subjected to heat treatment.

When the flash lamp annealing apparatus in an operation stopped state starts treatment for one lot, the first semiconductor wafer of the lot is transported into a chamber at approximately room temperature to be subjected to heating treatment. During the heating treatment, a semiconductor wafer supported by a susceptor in a chamber is subjected to assist heating to a predetermined temperature, and then a surface of the wafer is further increased in temperature to a treatment temperature by flash heating. As a result, heat conduction occurs from the semiconductor wafer increased in temperature to a structure such as a susceptor in the chamber to increase also temperature of the susceptor and the like. Such an increase in temperature of the susceptor or the like with the heating treatment of the semiconductor wafer is continued for about several sheets from the beginning of the lot, and when about ten semiconductor wafers are heated, the temperature of the susceptor reaches a constant stable temperature. In other words, while the first semiconductor wafer of the lot is held on a susceptor at room temperature to be treated, the tenth and subsequent semiconductor wafers are held on the susceptor heated to a stable temperature to be treated.

This causes a problem that temperature histories of a plurality of semiconductor wafers constituting the lot become non-uniform. In particular, about several sheets of semiconductor wafers from the beginning of the lot are supported by a susceptor at a relatively low temperature, so that surface temperature during irradiation of flashes of light may not reach a treatment temperature. When a semiconductor wafer held on a susceptor at a low temperature is irradiated with a flash of light, wafer warpage may occur due to a temperature difference between the susceptor and the semiconductor wafer to result in breakage of the semiconductor wafer.

Thus, to preliminarily increase temperature of a structure in a chamber, such as a susceptor before treatment of one lot is started, conventionally, a dummy wafer to be untreated is transported into the chamber and is held on a susceptor to be subjected to assist heating and flash heating treatment under the same conditions as the lot to be treated (dummy running). When the assist heating and the flash heating treatment are applied to about ten dummy wafers, the structure in a chamber, such as the susceptor reaches a stable temperature, and then the treatment of the first semiconductor wafer of the lot to be treated is started. This enables temperature histories of a plurality of semiconductor wafers constituting one lot to be uniform, as well as enables wafer warpage due to a temperature difference between a susceptor and a semiconductor wafer to be prevented.

Unfortunately, such dummy running not only consumes dummy wafers unrelated to treatment, but also takes considerable time to apply flash heating treatment to about ten dummy wafers, to cause a problem of preventing efficient operation of a flash lamp annealing apparatus.

SUMMARY

The present invention is intended for a heat treatment method for irradiating a substrate with light to heat the substrate.

A heat treatment method for heating a substrate by irradiating the substrate with light, including the steps of: (a) transporting a substrate into a chamber and placing the substrate on a susceptor; (b) irradiating the substrate placed on the susceptor with light from continuous lighting lamps; and (c) preheating the susceptor by placing a preheating substrate on the susceptor before a first substrate of one lot is transported into the chamber to heat the preheating substrate by using light irradiation from the continuous lighting lamps, wherein temperature of the susceptor is increased by successively irradiating a plurality of the substrates of the lot with light from the continuous lighting lamps, without preheating the susceptor, to become a constant temperature that is referred to as a stable temperature, and the susceptor is preheated to a temperature higher than the stable temperature in the step (c).

This enables a structure in the chamber, other than the susceptor, to be preheated to a temperature during steady treatment of the substrate in a short time, and even eliminating the dummy running enables a temperature history to be uniform for all the substrates constituting the lot.

It is preferable to further include the following step of: (d) maintaining the temperature of the susceptor after the step (c) at the stable temperature for a predetermined time.

This enables temperature of the structure in the chamber, including the susceptor, to be stable at the temperature of the substrate during the steady treatment.

It is preferable that after the step (d), the preheating substrate be transported from the chamber and the first substrate of the lot be transported into the chamber to be placed on the susceptor, at the time when the temperature of the susceptor decreases to a predetermined temperature by stopping light irradiation from the continuous lighting lamps.

This enables the temperature history of the substrates constituting the lot to be more uniform.

It is preferable that the preheating substrate have an emissivity higher than that of each of the substrates of the lot.

This causes the preheating substrate to efficiently absorb light radiated from the continuous lighting lamps to be rapidly raised in temperature.

Thus, it is an object of the present invention to eliminate dummy running.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view of a susceptor;

FIG. 4 is a sectional view of the susceptor;

FIG. 8 is a graph showing a correlation between the number of treated semiconductor wafers and temperature of the susceptor; and FIG. 9 is a graph showing a temperature change of a susceptor.

DESCRIPTION OF THE PREFERRED EMBODIMENTS

Preferred embodiments according to the present invention will now be described in detail with reference to the drawings.

Figure 1:
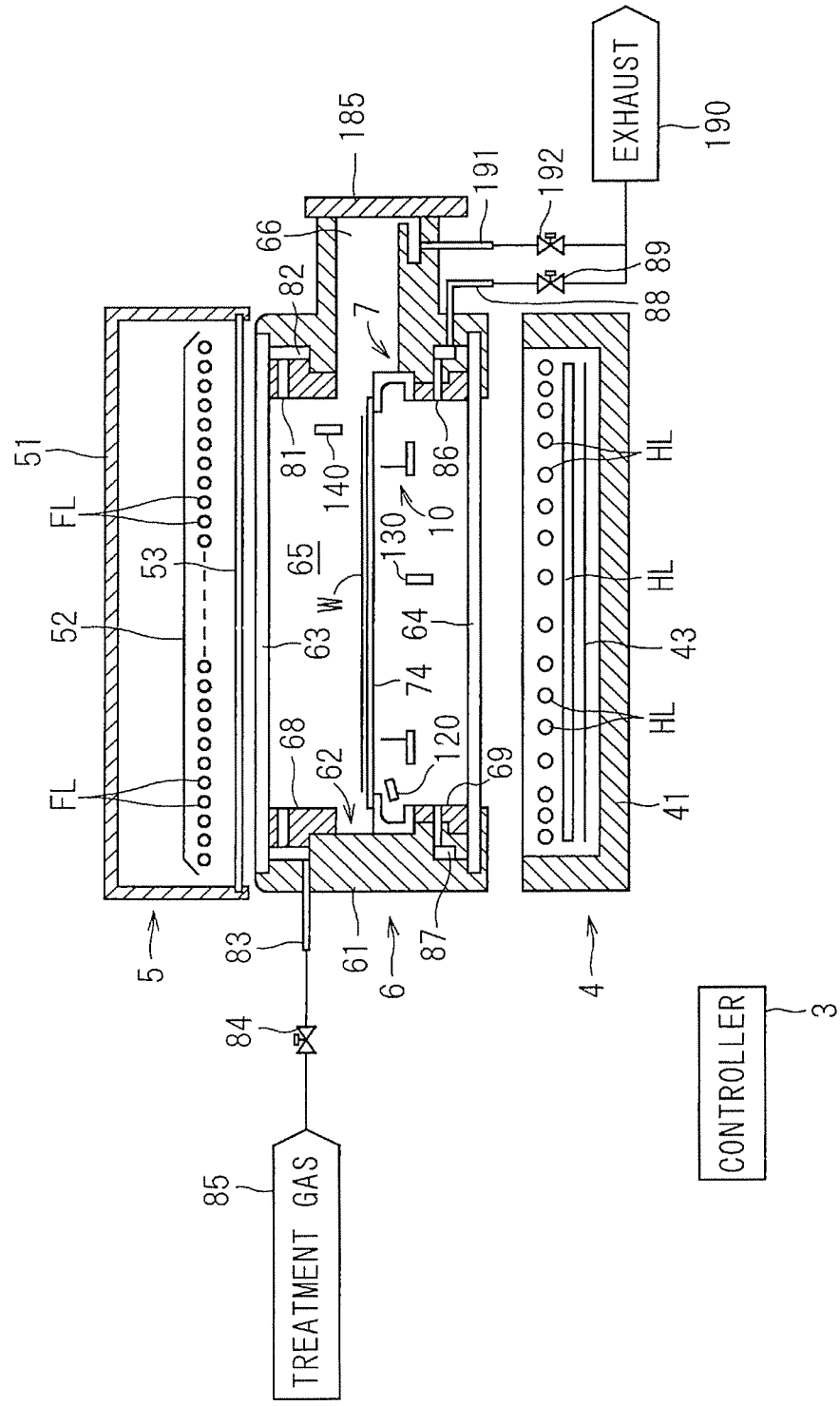
FIG. 1 is a longitudinal sectional view showing a configuration of a heat treatment apparatus used in a heat treatment method according to the present invention.

First, a heat treatment apparatus for performing a heat treatment method according to the present invention will be described. FIG. 1 is a longitudinal sectional view showing a configuration of a heat treatment apparatus 1 used in a heat treatment method according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in this preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
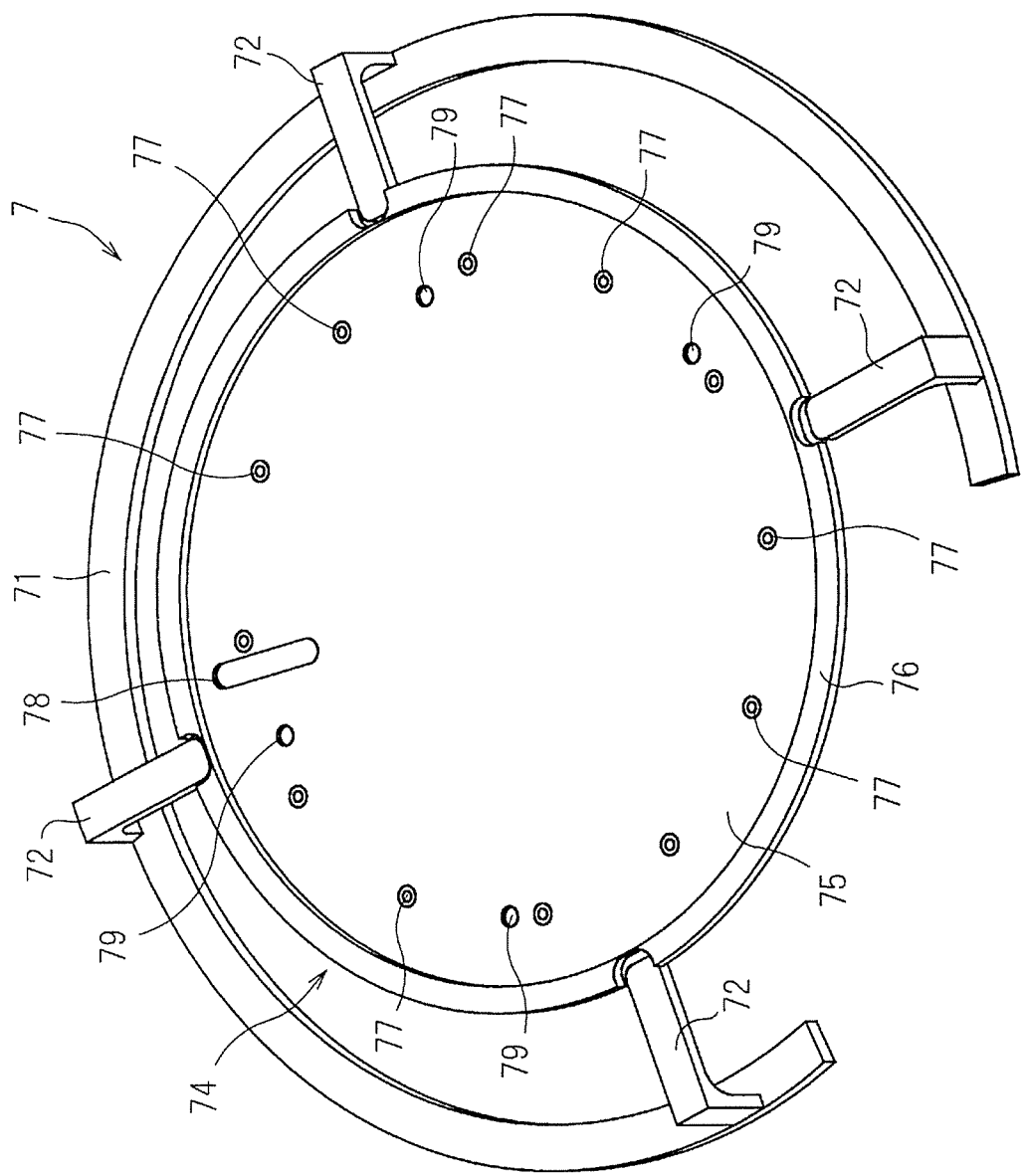
FIG. 2 is a perspective view showing the entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for a radiation thermometer 120 (with reference to FIG. 1) to receive radiation (infrared radiation) emitted from the lower surface of the semiconductor wafer W. Specifically, the radiation thermometer 120 receives the radiation emitted from the lower surface of the semiconductor wafer W through the opening 78, and measures the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
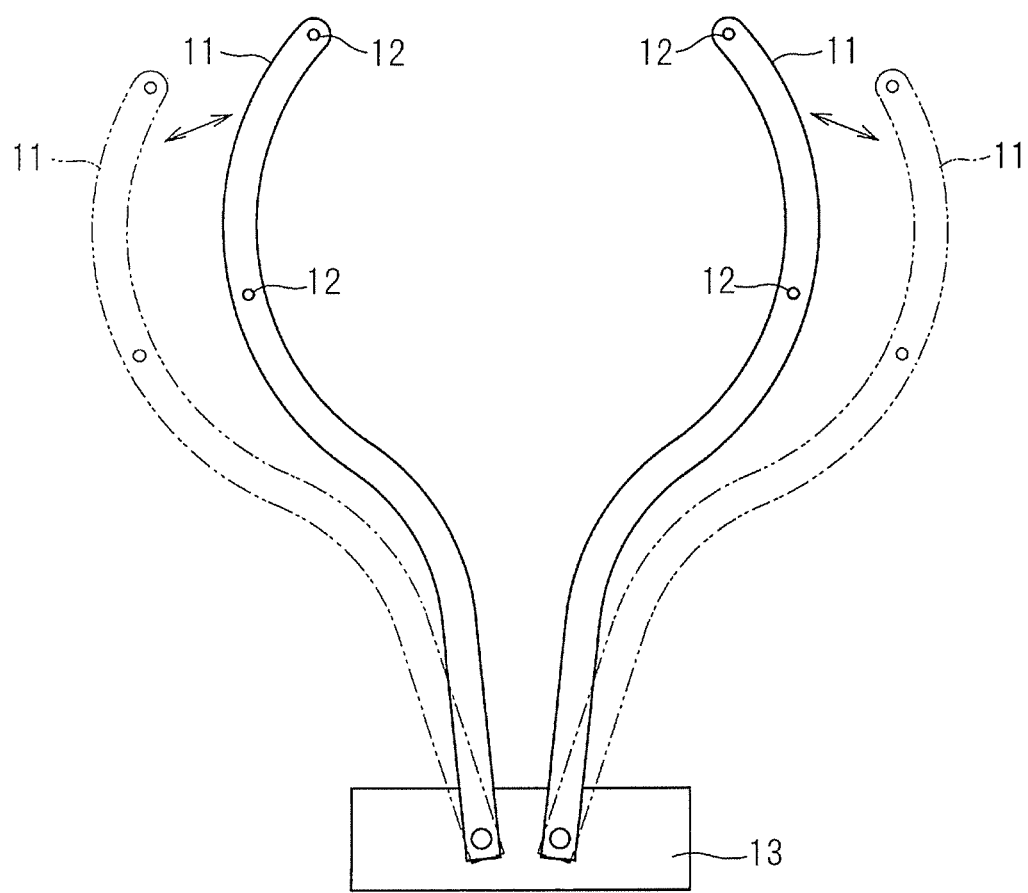
FIG. 5 is a plan view of a transfer mechanism.
Figure 6:
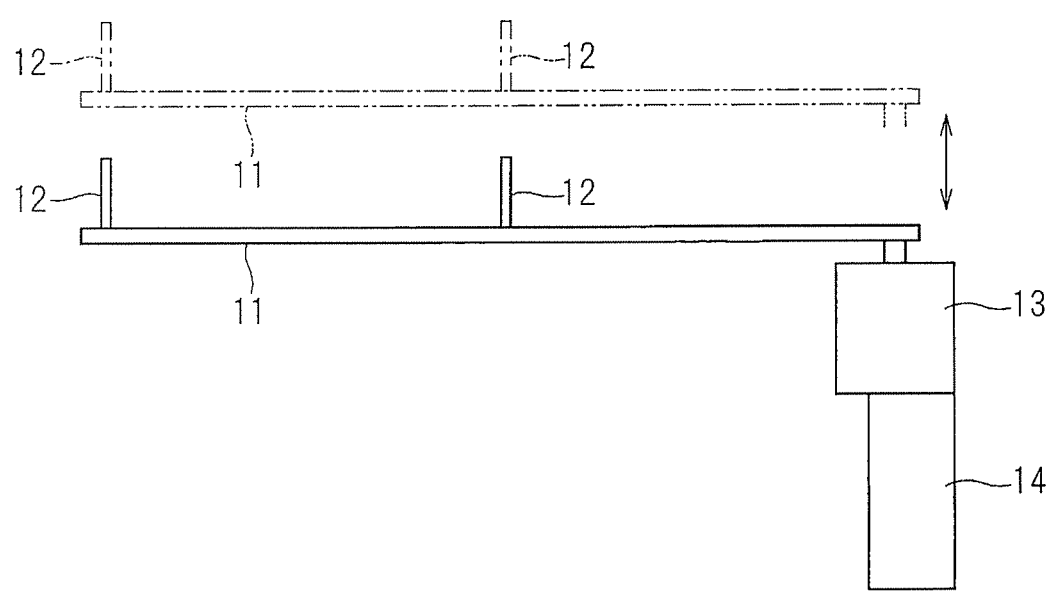
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

As shown in FIG. 1, the chamber 6 is provided with radiation thermometers 120, 130 and a temperature sensor 140. As described above, the radiation thermometer 120 measures temperature of a semiconductor wafer W through the opening 78 provided in the susceptor 74. The radiation thermometer 130 measures the temperature of the susceptor 74 by detecting infrared light emitted from the susceptor 74. On the other hand, the temperature sensor 140 measures the ambient temperature in the chamber 6.

The flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

Figure 7:
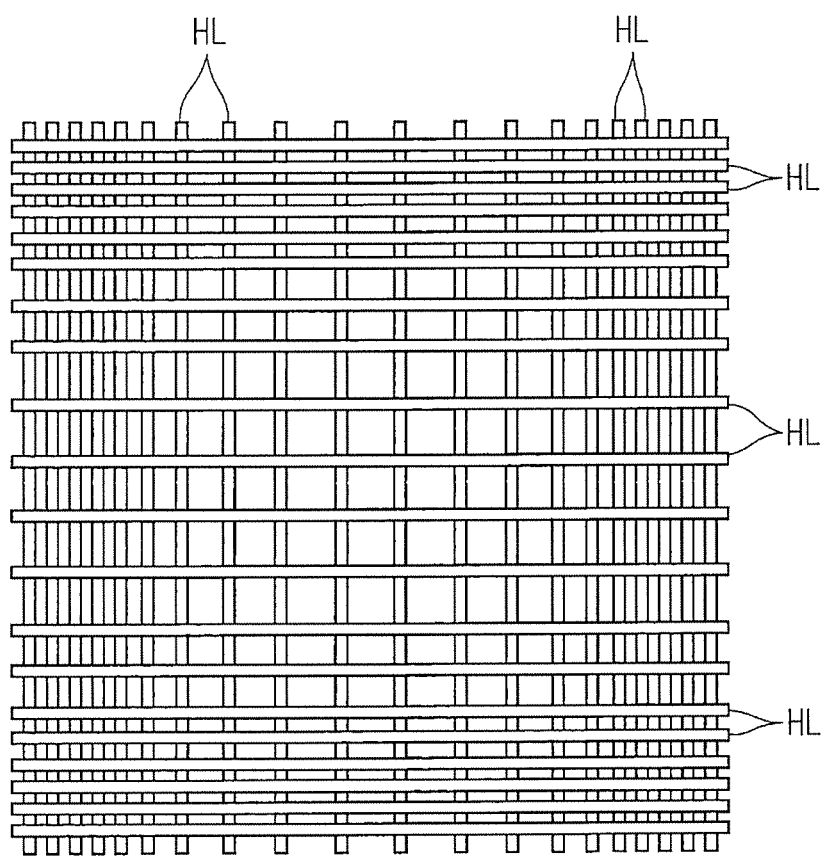
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, treatment operation in the heat treatment apparatus 1 will be described. First, a normal heat treatment procedure for a semiconductor wafer W to be treated will be described. The semiconductor wafer W to be treated is a semiconductor substrate made of silicon, having an impurities (ions) added by the ion implantation process. The impurities are activated by the heat treatment apparatus 1 performing the process of heating (annealing) the semiconductor wafer W by irradiation with a flash of light. The treatment procedure for a semiconductor wafer W, described below, proceeds under control of the controller 3 over each operating mechanism of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W to be treated into the heat treatment space 65 of the chamber 6 through the transport opening 66. While at this time, an atmosphere outside the apparatus may be sucked when the semiconductor wafer W is transported, nitrogen gas being continuously supplied into the chamber 6 flows out through the transport opening 66 to enable reduction in suction of an external atmosphere as much as possible.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is placed on the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is placed on the susceptor 74 of the holder 7 made of quartz, in a horizontal attitude, the 40 halogen lamps HL in the halogen heating part 4 turn on simultaneously to start preliminary heating (or assist heating). Halogen light emitted from the halogen lamps HL is transmitted through the lower chamber window 64 and the susceptor 74 both made of quartz, and impinges upon the lower surface of the semiconductor wafer W. By receiving halogen light irradiation from the halogen lamps HL, the semiconductor wafer W is assist heated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The radiation thermometer 120 measures temperature of the semiconductor wafer W when the halogen lamps HL perform the assist heating. Specifically, the radiation thermometer 120 receives infrared radiation emitted from the lower surface of the semiconductor wafer W held by the susceptor 74 through the opening 78 to measure temperature of the semiconductor wafer W increasing in temperature. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined assist heating temperature T1 or not. In other words, the controller 3 effects feedback control of the output from the halogen lamps HL so that the temperature of the semiconductor wafer W is equal to the assist heating temperature T1, based on the value measured with the radiation thermometer 120. The assist heating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat.

After the temperature of the semiconductor wafer W reaches the assist heating temperature T1, the controller 3 maintains the temperature of the semiconductor wafer W at the assist heating temperature T1 for a short time. Specifically, when the temperature of the semiconductor wafer W measured with the radiation thermometer 120 reaches the assist heating temperature T1, the controller 3 controls the output from the halogen lamps HL to maintain the temperature of the semiconductor wafer W at approximately the assist heating temperature T1.

The flash lamps FL in the flash heating part 5 irradiate the front surface of the semiconductor wafer W held by the susceptor 74 with a flash of light at the time when a predetermined time period has elapsed since the temperature of the semiconductor wafer W reached the assist heating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W subjected to the flash heating by the flash irradiation from the flash lamps FL momentarily increases to a treatment temperature T2 of 1000° C. or higher. After the impurities implanted in the semiconductor wafer W are activated, the temperature of the front surface of the semiconductor wafer W decreases rapidly. Because of the capability of increasing and decreasing the temperature of the front surface of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

After a predetermined time period has elapsed since the completion of the flash heating treatment, the halogen lamps HL turn off. This causes the temperature of the semiconductor wafer W to decrease rapidly from the assist heating temperature T1. The radiation thermometer 120 measures the temperature of the semiconductor wafer W decreasing in temperature, and a result of measurement is transmitted to the controller 3. The controller 3 monitors whether or not the temperature of the semiconductor wafer W decreases to a predetermined temperature on the basis of the result of measurement with the radiation thermometer 120. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

Typically, treatment of a semiconductor wafer W is performed per lot. One lot is a set of semiconductor wafers W to be subjected to the same treatment under the same conditions. Also in the heat treatment apparatus 1 of the present preferred embodiment, a plurality of (e.g., 25) semiconductor wafers W constituting one lot are sequentially transported into the chamber 6 one by one to be subjected to heating treatment.

When the heat treatment apparatus 1 in which treatment has not been performed for a while starts treatment of one lot without preheating the susceptor 74 and the like, the first semiconductor wafer W of the lot is transported into the chamber 6 at approximately room temperature to be subjected to flash heating treatment. Such a case includes a case where the first lot after the heat treatment apparatus 1 is started after maintenance is performed, and a case where a long time has elapsed after the previous lot was treated, for example. During the heating treatment, heat conduction occurs from the semiconductor wafer W increased in temperature to a structure inside the chamber, such as the susceptor 74, so that the susceptor 74 initially at room temperature gradually increases in temperature due to heat accumulation as the number of treated semiconductor wafers W increases.

FIG. 8 is a graph showing a correlation between the number of treated semiconductor wafers W and temperature of the susceptor 74. The susceptor 74 at room temperature before the start of the treatment gradually increases in temperature due to heat transfer from the semiconductor wafer W as the number of treated wafers of the semiconductor wafer W increases. Then, when the heating treatment is applied to about ten semiconductor wafers W, the temperature of the susceptor 74 reaches a certain stable temperature Ts. In the susceptor 74 having reached the stable temperature Ts, the amount of heat transfer from the semiconductor wafer W to the susceptor 74 and the amount of heat radiation from the susceptor 74 are balanced. The amount of heat transfer from the semiconductor wafer W is more than the amount of heat radiation from the susceptor 74 until temperature of the susceptor 74 reaches the stable temperature Ts, so that the temperature of the susceptor 74 gradually increases as the number of treated semiconductor wafers W increases. In contrast, the amount of heat transfer from the semiconductor wafer W is balanced with the amount of heat radiation from the susceptor 74 after the temperature of the susceptor 74 reaches the stable temperature Ts, so that the temperature of the susceptor 74 is maintained at a certain stable temperature Ts.

When treatment is started in the chamber 6 at room temperature as described above, there is a problem that temperature histories become uneven due to a difference in temperature of a structure in the chamber, like the susceptor 74, etc., between an initial semiconductor wafer W of the lot and the semiconductor wafer W in the middle of the lot. In addition, an initial semiconductor wafer W is subjected to flash heating treatment while being supported by the susceptor 74 at low temperature, so that wafer warpage may occur. For this reason, dummy running is conventionally performed as described above before treatment of one lot is started such that about ten dummy wafers to be untreated are sequentially transported into the chamber 6 to be subjected to assist heating treatment and flash heating treatment, similar to those for a semiconductor wafer W to be treated, to increase temperature of a structure in the chamber, like the susceptor 74, etc., to the stable temperature Ts. Such dummy running not only consumes dummy wafers unrelated to treatment, but also requires a considerable time (about 15 minutes to treat 10 dummy wafers). As a result, efficient operation of the heat treatment apparatus 1 is hindered as described above.

Thus, in the present preferred embodiment, before the first semiconductor wafer W of a production lot is transported into the chamber 6, a preheating substrate is transported into the chamber 6 at room temperature to be placed on the susceptor 74. Then, the preheating substrate is heated by light irradiation from the halogen lamps HL to preheat the susceptor 74. The preheating substrate has a size and a shape, similar to those of the semiconductor wafer W (in the present preferred embodiment, a disc shape of ϕ 300 mm). The preheating substrate has an emissivity higher than that of the semiconductor wafer W made of silicon. That is, the preheating substrate is formed of a material having an emissivity higher than silicon (e.g., silicon carbide (SiC)).

A procedure for transporting the preheating substrate into the chamber 6 is the same as the above-described procedure for transporting the semiconductor wafer W thereinto. That is, the transport robot outside the apparatus transports the preheating substrate into the chamber 6, and the lift pins 12 of the transfer mechanism 10 receive the preheating substrate. Then, the lift pins 12 descend to allow the preheating substrate to be placed on the susceptor 74.

After the preheating substrate is placed on the susceptor 74, the preheating substrate is irradiated with light from the 40 halogen lamps HL of the halogen heating part 4 to heat the preheating substrate. Heat is conducted from the preheating substrate, increased in temperature by the light irradiation from the halogen lamps HL, to the susceptor 74 made of quartz to preheat the susceptor 74.

FIG. 9 is a graph showing a temperature change of the susceptor 74. After the preheating substrate is placed on the susceptor 74 at room temperature, light irradiation from the halogen lamps HL is started at time t1. When receiving the light irradiation from the halogen lamps HL, the preheating substrate is heated and increases in temperature. Then, heat conduction from the preheating substrate having increased in temperature causes the susceptor 74 to be preheated, and its temperature rises from room temperature. The temperature of the susceptor 74 is measured by the radiation thermometer 130. The measured temperature of the susceptor 74 is transmitted to the controller 3. The controller 3 effects feedback control of the output from the halogen lamps HL on the basis of the measurement value by the radiation thermometer 130 so as to cause the temperature of the susceptor 74 to be equal to the preheating temperature Tv. The preheating temperature Tv is higher than the above-mentioned stable temperature Ts. For example, when the stable temperature Ts is 400° C., the preheating temperature Tv is 500° C.

When the temperature of the susceptor 74 reaches the preheating temperature Tv at time t2, the controller 3 adjusts the output of the halogen lamps HL to maintain the temperature of the susceptor 74 substantially at the preheating temperature Tv. In other words, the controller 3 controls the output of the halogen lamps HL so that the temperature of the susceptor 74 is maintained at the preheating temperature Tv. When the temperature of the susceptor 74 is raised to the preheating temperature Tv, a structure in the chamber, other than the susceptor 74, like the transfer arm 11 and the chamber side portion 61, is also preheated by heat radiation and heat conduction from the susceptor 74.

Next, at time t3 when a predetermined time elapses after the temperature of the susceptor 74 reaches the preheating temperature Tv, the controller 3 lowers the output of the halogen lamps HL to lower the temperature of the susceptor 74. When the temperature of the susceptor 74 decreases to the stable temperature Ts at time t4, the controller 3 adjusts the output of the halogen lamps HL to maintain the temperature of the susceptor 74 at the substantially stable temperature Ts. In other words, the controller 3 controls the output of the halogen lamps HL so that the temperature of the susceptor 74 is maintained at the stable temperature Ts.

The stable temperature Ts is a temperature of the susceptor 74, at which the temperature of the susceptor 74 becomes constant after being raised by heating treatment applied to a plurality of semiconductor wafers W of one lot by continuously irradiating them, in the chamber 6, with light from the halogen lamps HL without preheating the susceptor 74. The value of the stable temperature Ts is not particularly limited and varies in accordance with the assist heating temperature T1 of the semiconductor wafers W constituting the lot. The stable temperature Ts as described above may be preliminarily obtained by experiments, simulations, or the like, and stored in a storage unit of the controller 3.

Maintaining the temperature of the susceptor 74 at the stable temperature Ts causes a structure in the chamber, other than the susceptor 74, like the transfer arm 11, to be also stabilized to the temperature during steady treatment of the semiconductor wafer W. The preheating substrate is maintained at the preheating temperature Tv for about one minute (time from time t2 to time t3), for example, and the preheating substrate is maintained at the stable temperature Ts for about four minutes (time from time t4 to time t5), for example.

Subsequently, at time t5 when a predetermined time elapses after the temperature of the susceptor 74 reaches the stable temperature Ts, the controller 3 stops light irradiation from the halogen lamps HL. When the halogen lamp HL stops light irradiation, the temperature of the susceptor 74 decreases. When the temperature of the susceptor 74 decreases to replacement temperature Tw at time t6, the preheating substrate is transported from the chamber 6, and then the first semiconductor wafer W of a production lot is transported into the chamber 6 to be placed on the susceptor 74. Specifically, the lift pins 12 of the transfer mechanism 10 push up the preheating substrate at time t6, and then the transport robot outside the apparatus receives and transports the preheating substrate. Subsequently, the transfer mechanism 10 places the first semiconductor wafer W of the production lot, transported into the chamber 6 by the transport robot outside the apparatus, on the susceptor 74. Then, the assist heating treatment and the flash heating treatment are applied to the first semiconductor wafer W of the lot in accordance with the above-described procedure.

The replacement temperature Tw is a temperature of the susceptor 74 when the semiconductor wafer W after the heating treatment is transported from the chamber 6 to be replaced with an untreated semiconductor wafer W during steady treatment of the semiconductor wafer W constituting the lot. As described above, after the flash heating treatment of the semiconductor wafer W is finished, the halogen lamps HL are turned off to lower the temperature of the susceptor 74. The temperature of the susceptor 74 when the semiconductor wafer W after the heating treatment is transported from the chamber 6 is the replacement temperature Tw.

In the present preferred embodiments, before the first semiconductor wafer W of a production lot is transported into the chamber 6, a preheating substrate is placed on the susceptor 74. Then, the preheating substrate is heated by light irradiation from the halogen lamps HL to preheat the susceptor 74. Then, the susceptor 74 is heated to the preheating temperature Tv higher than the stable temperature Ts. Here, it is conceivable that preheating only the susceptor 74 may allow the temperature of the susceptor 74 to be simply raised to the stable temperature Ts. However, preheating the susceptor 74 to the stable temperature Ts as a target temperature requires a considerable time to raise the temperature of the susceptor 74 to the stable temperature Ts, so that it is difficult to remarkably reduce the amount of time from that required for the dummy running. In addition, only raising the temperature of the susceptor 74 to the stable temperature Ts requires a long time also to heat a structure in the chamber, other than the susceptor 74, like the transfer arm 11 and the chamber side portion 61, to the temperature during the steady treatment of the semiconductor wafer W.

Thus, preheating the susceptor 74 to the preheating temperature Tv higher than the stable temperature Ts, as in the present preferred embodiments, enables not only the susceptor 74 to be heated to the stable temperature Ts or more in a short time, but also a structure in the chamber, other than the susceptor 74, like the transfer arm 11, etc., to be preheated to the temperature during the steady treatment of the semiconductor wafer W in a short time by heat radiation from the susceptor 74. As a result, when treatment of the first semiconductor wafer W of one lot is started after the preheating, the temperature of the structure in the chamber, like the susceptor 74, becomes almost equal throughout the semiconductor wafers W constituting the lot to enable a temperature history to be uniform. In addition, an initial semiconductor wafer W of the lot is supported by the susceptor 74 heated to the stable temperature Ts, so that wafer warpage caused by a temperature difference between the susceptor 74 and the semiconductor wafer W can be prevented. That is, preheating the structure in the chamber, like the susceptor 74, enables treatment of a production lot to be started in a shorter time than the conventional dummy running in which heating treatment is applied to several dummy wafers. Even eliminating the dummy running enables the temperature history throughout the semiconductor wafers W constituting the lot to be uniform, so that the substrate treatment apparatus 1 can be efficiently operated.

The susceptor 74 is maintained at the stable temperature Ts after the temperature of the susceptor 74 is raised to the preheating temperature Tv higher than the stable temperature Ts, so that the structure in the chamber, including the susceptor 74, can be stabilized to the temperature during the steady treatment of the semiconductor wafer W.

When light irradiation from the halogen lamp HL is stopped to lower the temperature of the susceptor 74 to the replacement temperature Tw after the susceptor 74 is maintained at the stable temperature Ts, a preheating substrate is transported from the chamber 6 and the first semiconductor wafer W of one lot is transported into the chamber 6. This causes the temperature of the susceptor 74 when the first semiconductor wafer W is transported into the chamber 6 to be the same as the temperature of the susceptor 74 when an untreated semiconductor wafer W is transported into the chamber 6 during the steady treatment of the semiconductor wafer W, so that the temperature history of the semiconductor wafers W constituting the lot can be made more uniform.

In the present preferred embodiments, the preheating substrate has an emissivity higher than that of each of the semiconductor wafers W of the lot. This causes the preheating substrate to efficiently absorb light radiated from the halogen lamps HL to be rapidly raised in temperature during preheating.

While the preferred embodiments according to the present invention have been described hereinabove, various modifications of the present invention in addition to those described above may be made without departing from the scope and spirit of the invention. For example, while the preheating substrate is made of silicon carbide in the above embodiments, the present invention is not limited to this. For example, a film of silicon nitride (Si3N4) may be formed on a surface of a silicon semiconductor substrate to be used as a preheating substrate. The preheating substrate provided on its surface with the film of silicon nitride also has an emissivity higher than that of the silicon semiconductor wafer W. In addition, a high concentration impurity (dopant) film may be formed on a surface of a silicon semiconductor substrate, or a high concentration impurity (dopant) may be implanted to the silicon semiconductor substrate, to form a preheating substrate. The preheating substrate as described above also has an emissivity higher than that of a mere silicon semiconductor wafer W. Further, a silicon semiconductor substrate may be used as a preheating substrate. However, it is preferable to use a preheating substrate having an emissivity higher than that of silicon because the preheating substrate can be raised in temperature in a short time.

In the above preferred embodiments, while controlling the output of the halogen lamps HL on the basis of a measured temperature value of the susceptor 74 by the radiation thermometer 130, the controller 3 may control the output of the halogen lamps HL on the basis of a measured temperature value of the preheating substrate by the radiation thermometer 120 or a measured value of ambient temperature in the chamber 6 by the temperature sensor 140. Alternatively, the controller 3 may control the output of the halogen lamps HL on the basis of a plurality of measured temperature values among those by the radiation thermometer 120, the radiation thermometer 130, and the temperature sensor 140.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as continuous lighting lamps to preheat the semiconductor wafer W.

A substrate to be treated by the heat treatment apparatus 1 is not limited to a semiconductor wafer, and may be a glass substrate to be used for a flat panel display such as a liquid crystal display device, and a substrate for a solar cell. Also, the technique according to the present invention may be applied to the heat treatment of high dielectric constant gate insulator films (high-k films), to the joining of metal and silicon, and to the crystallization of polysilicon.

Also, the heat treatment technique according to the present invention is not limited to the flash lamp annealer, but may be applied to apparatuses including heat sources other than flash lamps such as single-wafer type lamp annealers employing halogen lamps or CVD apparatuses. Particularly, the technique according to the present invention can be suitably applied to a backside annealing apparatus in which a halogen lamp is disposed under a chamber and heat treatment is performed by irradiating a back surface of a semiconductor wafer with light.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for heating a substrate by irradiating the substrate with light, the heat treatment method comprising the steps of:
   (a) preheating, before a first substrate of one lot is transported into a chamber, a susceptor to a preheat temperature higher than a stable temperature by placing a preheating substrate on said susceptor to heat said preheating substrate using light irradiation from continuous lighting lamps;
   (b) transporting the first substrate of the one lot into the chamber and placing the first substrate on the preheated susceptor;
   (c) irradiating the first substrate placed on said susceptor with the light irradiation from said continuous lighting lamps; and
   (d) maintaining, after said step (a) and before the first substrate of the one lot is transported into the chamber, said susceptor at said stable temperature for a predetermined time,
   wherein said stable temperature is a constant temperature at which said susceptor is maintained while the first substrate is irradiated using said continuous lighting lamps.

2. The heat treatment method according to claim 1, wherein
   after said step (d), when a temperature of said susceptor decreases from the stable temperature to a predetermined temperature by stopping light irradiation from said continuous lighting lamps, said preheating substrate is transported from said chamber and the first substrate of said lot is transported into said chamber to be placed on the preheated susceptor.

3. The heat treatment method according to claim 1, wherein said preheating substrate has an emissivity higher than that of each of the substrates of said lot.

4. The heat treatment method according to claim 1, wherein said susceptor is made of quartz.

* * * * *